(12) United States Patent
Kang

(10) Patent No.: US 7,417,322 B2
(45) Date of Patent: Aug. 26, 2008

(54) MULTI-CHIP MODULE WITH EMBEDDED PACKAGE AND METHOD FOR MANUFACTURING THE SAME

(75) Inventor: Jung-Kun Kang, Kaohsiung (TW)

(73) Assignee: Advanced Semiconductor Engineering Inc., Kaohsiung (TW)

( * ) Notice: Subject to any disclaimer, the term of this patent is extended or adjusted under 35 U.S.C. 154(b) by 204 days.

(21) Appl. No.: 11/106,554

(22) Filed: Apr. 15, 2005

(65) Prior Publication Data

US 2005/0230799 A1 Oct. 20, 2005

(30) Foreign Application Priority Data

Apr. 19, 2004 (TW) .............................. 93110865 A

(51) Int. Cl.
*H01L 23/48* (2006.01)

(52) U.S. Cl. .............................. 257/777; 257/E25.006; 438/107

(58) Field of Classification Search ......... 438/106–127, 438/613, 617; 257/678–698, 738, 777, 778, 257/E25.006, E25.013, 780, 790
See application file for complete search history.

(56) References Cited

U.S. PATENT DOCUMENTS

| | | | | |
|---|---|---|---|---|
| 5,637,919 | A | * | 6/1997 | Grabbe ........................ 257/690 |
| 6,509,639 | B1 | * | 1/2003 | Lin ............................. 257/686 |
| 6,713,857 | B1 | * | 3/2004 | Tsai ............................. 257/686 |
| 6,906,415 | B2 | * | 6/2005 | Jiang et al. ................... 257/723 |
| 6,919,631 | B1 | * | 7/2005 | Hoffman et al. ............. 257/707 |
| 6,921,968 | B2 | * | 7/2005 | Chung ......................... 257/686 |
| 7,198,980 | B2 | * | 4/2007 | Jiang et al. ................... 438/107 |
| 2005/0205979 | A1 | * | 9/2005 | Shin et al. .................... 257/678 |

FOREIGN PATENT DOCUMENTS

TW 533561 5/2003

\* cited by examiner

*Primary Examiner*—Brook Kebede
*Assistant Examiner*—Khiem D Nguyen
(74) *Attorney, Agent, or Firm*—Troxell Law Office, PLLC

(57) ABSTRACT

A multi-chip module comprises a first package and at least a second package. The first package includes a substrate, at least a first chip, an encapsulant, and a plurality of solder balls. The substrate has an upper surface, a lower surface, and at least an opening. The first chip is disposed on the upper surface of the substrate and is electrically connected to the substrate. The encapsulant is formed on the upper surface of the substrate to seal the first chip. In addition, the solder balls are placed on the lower surface of the substrate. The second package is embedded in the opening of the substrate of the first package. The second package includes a plurality of electrical terminals which are exposed out of the first package to be similar to the solder balls for external connection. Accordingly, the solder balls and the electrical terminals can be used as SMT connection terminals of the multi-chip module.

18 Claims, 2 Drawing Sheets

MULTI-CHIP MODULE WITH EMBEDDED PACKAGE AND METHOD FOR MANUFACTURING THE SAME

FIELD OF THE INVENTION

The present invention relates to a multi-chip module, and more particularly to a multi-chip module with an embedded semiconductor package and a method for manufacturing the multi-chip module.

BACKGROUND OF THE INVENTION

As demands for higher IC operation speeds with smaller dimensions increases, it becomes a trend to integrate as many functions as possible into a single chip, i.e., system on chip, SOC, or to integrate several chips with different functions into a single package, such as, system in package, SIP. When integrating the functions of analog, memory, and logic functions into one single chip, there are some unsolved integration issues such as noise and voltage drop. R.O.C. Taiwan Patent publication No. 533,561 discloses a multi-chip stacked package, which comprises a substrate with an opening, at least a first chip, at least a second ship, at least a third chip, and an encapsulant. The opening penetrates the substrate. Moreover, the substrate has at least two layers of circuits inside for signal transmissions. The first chip is a flip chip attached to the first surface of the substrate above the opening through a plurality of flip-chip bumps for electrical connections to the substrate. The second chip is attached to the back surface of the first chip and is electrically connected to the substrate through a plurality of bonding wires. The third chip is flip-chip attached to the active surface of the first chip within the opening through a plurality of flip-chip bumps. Normally the third chip is SDRAM or another type of memory chip. An underfill material is disposed between the first chip and the third chip and between the first chip and the substrate. The encapsulant is formed on the top of the substrate to cover the bonding wires and the second chip. Since the third chip is electrically connected to the substrate through the first chip, the redistribution circuit design in the first chip becomes more complicated. In addition, since the signals of the third chip have to go through the first chip, noise will become an issue. To ensure the quality, the whole multi-chip package passes through burn-in. But another problem is that the third chip in the multi-chip package is not interchangeable when the multi-chip package had been burn-in and tested.

SUMMARY OF THE INVENTION

It is a main purpose of the present invention to provide a multi-chip module with an embedded package. Therein, at least a second package is embedded in an opening of the substrate of a first package. A plurality of solder balls of the first package and a plurality of electrical terminals of the second package are exposed out of the substrate for external connection. Accordingly, the solder balls and the electrical terminals are placed on a same SMT surface so that the first package and the second package can be mounted on an external electronic device at the same time.

It is a second purpose of the present invention to provide a multi-chip module with an embedded package. Therein, at least a second package is embedded in an opening of a substrate of a first package, and a plurality of solder balls of the first package and a plurality of electrical terminals of the second package are placed on the same SMT surface. Accordingly, the second package in the multi-chip module is interchangeable and the multi-chip module has a reduced height.

It is a third purpose of the present invention to provide a multi-chip module with an embedded package. Therein, at least a second package is embedded in the first package and has a plurality of electrical terminals electrically isolated from the first package. Therefore, the electrical interference and noise between the first package and the second package can be eliminated.

It is a fourth purpose of the present invention to provide a method for manufacturing a multi-chip module with an embedded package. A first package and at least a second package are individually tested and verified as known good packages, then the second package is embedded in the opening of the substrate of the first package. Therefore, the yield of the multi-chip module can be assured.

According to the present invention, a multi-chip module comprises a first package and at least a second package embedded in the first package. The first package includes a substrate, a chip, an encapsulant, and a plurality of solder balls. The substrate has an upper surface, a lower surface, and an opening penetrating the upper surface and the lower surface. The chip of the first package is attached to and electrically connected to the substrate. The encapsulant of the first package is formed on the upper surface of the substrate. A plurality of solder balls are placed on the lower surface of the substrate. The second package is embedded in the opening of the substrate of the first package, for example, an adhesive layer in the opening is used to mechanically connect the second package with the first package. The second package includes a plurality of electrical terminals to be formed on a same SMT surface with the solder balls of the first package. Accordingly, the multi-chip module can be easily implemented in SMT connection.

DETAIL DESCRIPTION OF THE INVENTION

Please refer to the attached drawings, the present invention will be described by means of embodiment(s) below.

Figure 1:
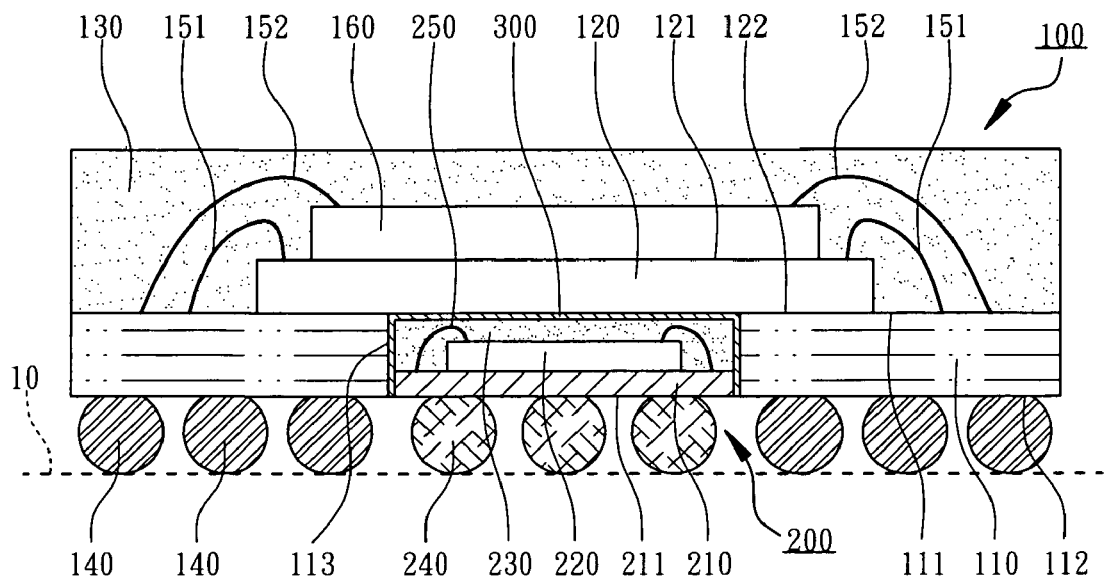
FIG. 1 is a cross-sectional view of a multi-chip module according to the preferred embodiment of this invention.
Figure 2:
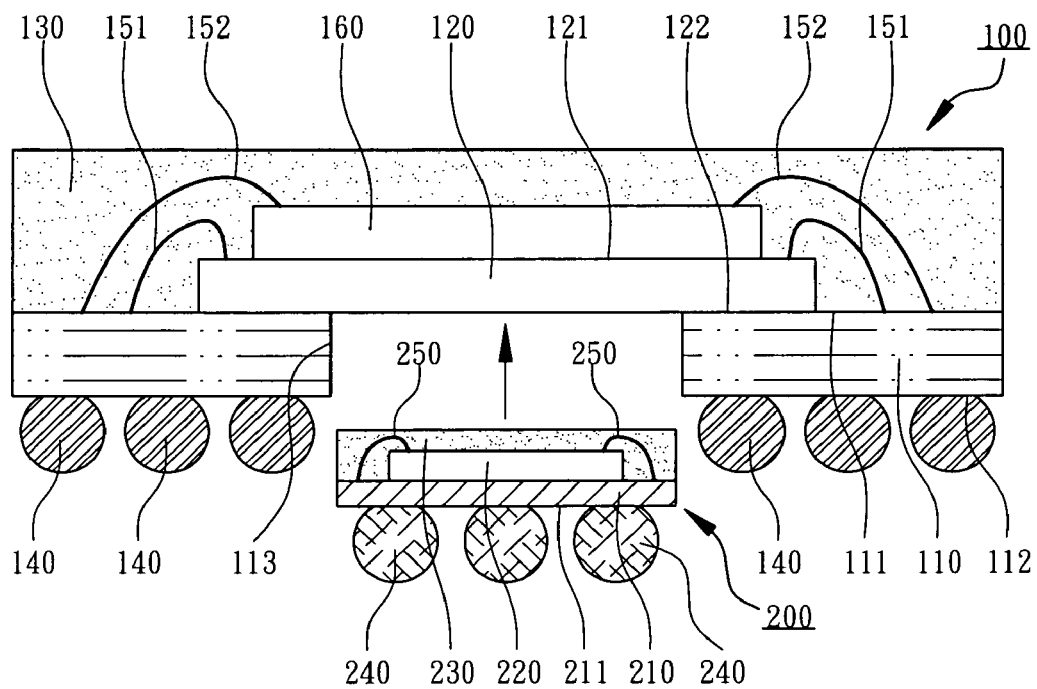
FIG. 2 is a cross-sectional view of the multi-chip module when embedding a second package according to the preferred embodiment of this invention.

In the first embodiment according to the present invention, a multi-chip module is shown in FIGS. 1 and 2, which comprises a first package 100 and at least a second package 200. The first package 100 includes a substrate 110, at least a first chip 120 and 160, an encapsulant 130, and a plurality of solder balls 140. The thickness of the substrate 110 is preferably less than 0.5 mm. The substrate 110 has an upper surface 111, a lower surface 112, and an opening 113 which may penetrate from the upper surface 111 to the lower surface 112 or not. In the present embodiment, the opening 113 is a through hole for accommodating the second package 200. The first chips 120 and 160 may be logic or ASIC chip(s). In the present embodiment, there are two first chips 120 and 160 stacked each other. One of the first chips 120 is attached to the upper surface 111 with its active surface 121 facing upward. The other of the first chips 160 is stacked on the attached first chip 120. A plurality of bonding wires 151 are used to electrically connect the first chip 120 with the substrate 110.

Therein, the first chip 120 has an active surface 121 and a corresponding back surface 122. More clearly, the back surface 122 can be partially exposed out of the opening 113. If necessary, a plurality of bonding wires 152 can electrically connect the other first chip 160 with the substrate 110. The encapsulant 130 is formed on the upper surface 111 to encapsulate the first chips 110 and 160, and the bonding wires 151 and 152. In addition, the solder balls 140 are placed on the lower surface 112.

In this embodiment, the second package 200 is a known good package going through burn-in and testing processes. The second package 200 includes a plurality of electrical terminals 240. It is essential that the second package 200 is embedded in the opening 113 of the substrate 110 of the first package 100. Thereby, the electrical terminals 240 are exposed out of the first package 100 to be similar to the solder balls 140 for external connection. Preferably, an adhesive layer 300 in the opening 113 is used to mechanically connect the second package 200 with the first package 100. The electrical terminals 240 can be the same as the solder balls 140 of the first package 100. The second package 200 may be chosen from a group consisting of BGA (Ball Grid Array) package, flip chip package, CSP (Chip Scale Package), and WLCSP (Wafer Level Chip Scale Package) for the present embodiment. The second package 200 further includes a second substrate 210, a second chip 220, and an encapsulant 230. The second substrate 210 has a second lower surface 211 for fixing the electrical terminals 240. Preferably, the second lower surface 211 is coplanar with the lower surface 112 of the substrate 110 of the first package 100. In this embodiment, the second chip 220 is a memory chip, such as SDRAM, needed to be burn-in. A plurality of bonding wires 250 are used to electrically connect the second chip 220 with the second substrate 210. The encapsulant 230 encapsulates the second chip 220 and the bonding wires 250. The electrical terminals 240 and the solder balls 140 are formed on a same SMT surface 10. Preferably, the electrical terminals 240 are electrically isolated from the solder balls 140. The electrical transmission of the second chip 220 can be directly connected to an external electronic device without passing through the first chips 120 and 160 in order to reduce noise. Therefore, the total height of the multi-chip module 100 can be well controlled to be no greater than 1.2 mm.

According to the present invention, the package 200 is embedded in the opening 113 of the substrate 110 of the first package 100 such that the electrical terminals 240 of the second package 200 and the solder balls 140 of the first package 100 are formed on the same SMT surface 10. Therefore, the first package 100 and the second package 200 can be electrically connected to an external electronic device by a SMT process simultaneously. The height of the multi-chip module can be well controlled under 1.2 mm, moreover, the electrical interference and noise that may exist between the first package 100 and the second package 200 can be eliminated because that there is no electrical connection between the first package 100 and the second package 200.

Figure 3:
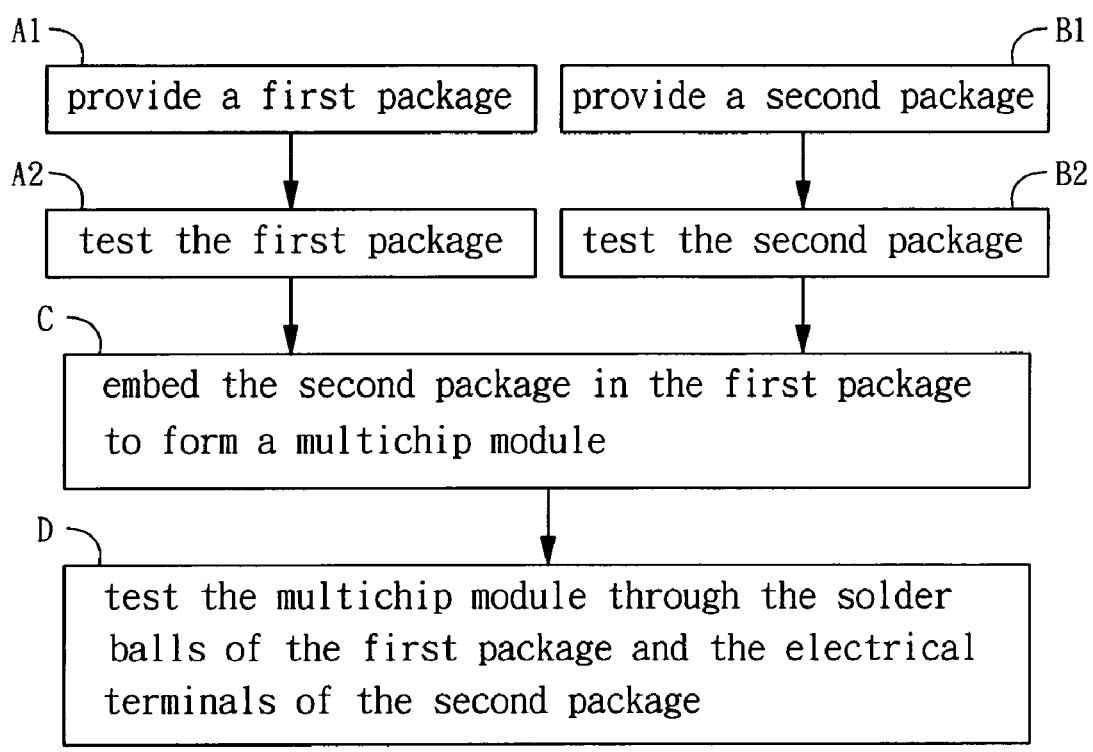
FIG. 3 is a flow diagram illustrating manufacture of the multi-chip module.

A method for manufacturing the multi-chip module according to the present invention is shown in FIG. 3. Firstly, step A1 and step B1 are performed individually to provide the first package 100 and the second package 200. Then, step A2 follows the step A1 to test the first package 100, and step B2 follows step B1 to test the second package 200. Accordingly, the first package 100 and the second package 200 are individually tested to assure that they are known good packages or not before the embedding step C. Moreover, Step B2 includes a burn-in process for the second package 200. Then, step C is performed to embed the second package 200 in the first package 100 to form a multi-chip module. Preferably, step D of testing the multi-chip module is performed. By probing the solder balls 140 of the first package 100 and the electrical terminals 240 of the second package 200, the multi-chip module can be tested to assure a known good module or not.

The above description of embodiments of this invention is intended to be illustrative and not limiting. Other embodiments of this invention will be obvious to those skilled in the art in view of the above disclosure.

What is claimed is:

1. A multi-chip module comprising: a first package including:
   a substrate having an upper surface, a lower surface, and an opening penetrating the substrate to extend from the upper surface to the lower surface of the substrate;
   at least a first chip disposed on the upper surface and electrically connecting to the substrate;
   an encapsulant forming on the upper surface; and a plurality of solder balls placed on the lower surface; and
   at least a second package including: a second chip; and a plurality of electrical terminals; wherein the second package is embedded in the opening such that the electrical terminals are exposed out of the first package to be similar to the solder balls for external connection,
   wherein the second package further comprises a second substrate having a second lower surface coplanar with the lower surface of the substrate of the first package.

2. The multi-chip module of claim 1, wherein the solder balls and the electrical terminals are formed on a same SMT surface.

3. The multi-chip module of claim 1, wherein the height of the multi-chip module is not greater than 1.2 mm.

4. The multi-chip module of claim 1, wherein the electrical terminals are electrically isolated from the solder balls.

5. The multi-chip module of claim 1, wherein the substrate of the first package is not greater than 0.5 mm.

6. The multi-chip module of claim 1, further comprising an adhesive layer in the opening mechanically connecting the second package with the first package.

7. The multi-chip module of claim 1, wherein the opening penetrates from the upper surface to the lower surface.

8. The multi-chip module of claim 7, wherein the opening partially exposes a back surface of the first chip.

9. The multi-chip module of claim 1, wherein the second chip is a memory chip.

10. The multi-chip module of claim 9, wherein the second package is a burn-in known good package.

11. The multi-chip module of claim 1, wherein the first chip is a logic chip or an ASIC chip.

12. The multi-chip module of claim 1, wherein the second package is selected from a group consisting of BGA package, flip chip package, CSP (Chip Scale Package), and WLCSP (Wafer Level Chip Scale Package).

13. A method for manufacturing a multi-chip module, comprising:
   providing a first package including a substrate, at least a first chip, an encapsulant, and a plurality of solder balls, the substrate having an upper surface, a lower surface, and an opening penetrating the substrate to extend from the upper surface to the lower surface of the substrate, the first chip being disposed on the upper surface of the substrate and electrically connected to the substrate, the encapsulant being formed on the upper surface, the solder balls being placed on the lower surface of the substrate;

providing at least a second package including a second chip and a plurality of electrical terminals;

testing the second package to assure the second package is a known good package; and embedding the known good second package in the opening such that the electrical terminals are exposed out of the first package to be similar to the solder balls for external connection, wherein the second package further includes a second substrate having a second lower surface coplanar with the lower surface of the substrate of the first package.

14. The method of claim 13, wherein the solder balls and the electrical terminals are formed on a same SMT surface.

15. The method of claim 13, further comprising a step of testing the first package to assure the first package is a known good package.

16. The method of claim 13, further comprising a step of testing the multi-chip module through the solder balls and the electrical terminals after the embedding step.

17. The method of claim 13, wherein the second chip is a memory chip.

18. The method of claim 17, wherein the step of testing the second package includes a burn-in process.

* * * * *